United States Patent
Chen et al.

(10) Patent No.: US 6,544,887 B1
(45) Date of Patent: Apr. 8, 2003

(54) POLYCIDE ETCH PROCESS

(75) Inventors: Win Chen, Fremont, CA (US);
Wen-Chiang Tu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/541,432

(22) Filed: Mar. 31, 2000

(51) Int. Cl.$^7$ .................. H01L 21/4763; H01L 21/44; H01L 21/302; H01L 21/461
(52) U.S. Cl. ............... 438/645; 438/649; 438/655; 438/721; 438/735
(58) Field of Search ............. 438/720, 723, 438/735, 740, 645, 649, 655

(56) References Cited

U.S. PATENT DOCUMENTS

| | | |
|---|---|---|
| 4,818,334 A | 4/1989 | Shwartzman et al. |
| 5,259,923 A | 11/1993 | Hori et al. |
| 5,851,926 A | 12/1998 | Kumar et al. |
| 5,914,276 A | 6/1999 | Shin et al. |
| 6,081,334 A * | 6/2000 | Grimbergen et al. |
| 6,136,211 A * | 10/2000 | Qian et al. |
| 6,316,313 B1 * | 11/2001 | Park et al. |
| 6,323,047 B1 * | 11/2001 | Wang et al. |

FOREIGN PATENT DOCUMENTS

| | | |
|---|---|---|
| EP | 0200951 | 12/1986 |
| EP | 0260261 | 11/1987 |
| EP | 0334525 | 3/1989 |
| EP | 0516043 | 12/1992 |
| EP | 0731501 | 11/1996 |
| JP | 62250642 | 10/1987 |
| JP | 01239932 | 9/1989 |
| JP | 04062839 | 2/1992 |
| JP | 4294533 | 10/1992 |
| JP | 06045290 | 2/1994 |
| JP | 7263406 | 10/1995 |
| JP | 10116824 | 5/1998 |
| JP | 11054481 | 2/1999 |

OTHER PUBLICATIONS

Heslop, C.J.; Belka, A/Etching of Aluminium and Polysilicon in Chlorinated Plasmas/1982/IEEColloquium (Digest) n 1982/24.

* cited by examiner

Primary Examiner—Richard Booth
Assistant Examiner—Ron Pompey
(74) Attorney, Agent, or Firm—Martine & Penilla, LLP

(57) ABSTRACT

A method for etching contact openings into a polycide layer including a metal silicide layer and a polysilicon layer comprises providing a substrate that includes a polycide layer, forming a patterned photoresist mask, and etching with a series of plasmas. The etches include a silicide etch, a polycide etch including chlorine gas and nitrogen gas where the nitrogen flow rate is between 20% and about 30% of the sum of the nitrogen flow rate plus the chlorine flow rate, and a poly overetch. A polycide etch with a composition in the specified range will have a polycide selectivity greater than one.

16 Claims, 4 Drawing Sheets

POLYCIDE ETCH PROCESS

BACKGROUND OF THE INVENTION

1. The Field of the Invention

The present invention relates to semiconductor processing and more particularly to a process for forming openings in layered structures such as tungsten silicide (WSi) over polycrystalline silicon (polysilicon).

2. The Relevant Art

Semiconductor processing to create integrated circuits and the like involves repeated cycles through a series of masking operations, processing operations, and cleaning operations. Some passes through the cycle create new layers, some form holes in existing layers, others remove layers, and still others modify exposed surfaces. FIG. 1 illustrates a cross-section of a typical semiconductor stack 10 of the prior art that is commonly fabricated in the manufacture of integrated circuits. The stack 10 includes a substrate 12, a dielectric layer 14, a polysilicon layer 16, a WSi layer 18, and a photomask 20. An opening 22 is formed over a desired location on the dielectric layer 14 by first forming an opening in the photomask 20 by photolithography techniques that are well known in the art. The opening in the photomask 20 allows the exposed surface to be further processed, in this case to form an opening in the WSi layer 18 and the polysilicon layer 16. Many different techniques are known in the art for etching semiconductor layers, but for etching WSi 18 over polysilicon 16 a frequently used technique involves plasma etching with a mixture of chlorine gas and oxygen gas.

Many semiconductor devices presently manufactured include numerous semiconductor stacks 10 in successive layers. The fabrication of such devices is made more complex by the topography that develops after several stacks 10 have already been created. FIG. 2 shows a cross-section of a more complex stack 24 during the formation of openings 22 in two separate locations. Stack 24 includes a polysilicon layer 26 with a topography that is conformal with the layer beneath it (not shown). Typically, this underlying layer is a dielectric layer such as a thermally grown silicon dioxide film that itself has a topography dictated by the layers beneath it. Formed over the polysilicon layer 26 is a WSi layer 28. WSi layer 28 is commonly a thick layer that can be mechanically or chemically polished to form a flat surface 29, as shown in FIG. 2. Stack 24 also includes a photomask 20 disposed over the WSi layer 28. The photomask 20 further includes openings 22 over portions of the WSi layer 28 having different thicknesses.

In FIG. 2, a plasma etch with a mixture of chlorine and oxygen gases is applied to the stack 24 to etch the WSi layer 28 where exposed by the openings 22 in the photomask 20. This etch is referred to as a silicide etch. Openings 22 grow deeper at approximately the same rate until one advances to the polysilicon layer 26 as illustrated. At this point, because polysilicon generally etches at a faster rate than WSi when etched with a plasma of chlorine and oxygen, the first opening to reach the polysilicon layer 26 will etch through to the dielectric layer 14 not only well before the other opening, but possibly before the other opening even reaches the polysilicon layer 26. Commonly, a silicide overetch is applied to remove any residual silicide remaining in the openings 22 at the completion of the initial silicide etch. The silicide overetch is typically nothing more than the initial silicide etch applied for an additional length of time.

Selectivity is a term commonly used in the art to represent the ratio between the etch rates of two different materials under common conditions. The ratio of the WSi etch rate to the polysilicon etch rate, commonly known as the polycide selectivity, is well known to be less than one for plasma etching with most ratios of chlorine to oxygen. The lower the polycide selectivity the greater the disparity between the depths of the several openings 22 where the thickness of the WSi layer 28 is not uniform.

Following the silicide overetch a second plasma etch using a mixture of hydrogen bromide (HBr) and chlorine gases, commonly referred to as a poly etch, is applied. The poly etch etches polysilicon well but etches WSi poorly. Thus, the poly etch has a low selectivity for WSi over polysilicon, necessitating the preceding silicide overetch to make sure residual WSi is removed as the later processing is not likely to remove it. Lastly, a poly overetch is applied to clean up any exposed residual portions of the polysilicon layer 26. A poly overetch should have a high selectivity for polysilicon over the dielectric. Put another way, the poly overetch ideally should etch polysilicon but not silicon dioxide so that the ratio of their etch rates approaches infinity. A common poly overetch employs a plasma of HBr, He, and $O_2$.

It will be apparent, therefore, that the prior art calls for four etching steps to form contact openings in a polycide layer where the layer thicknesses are not everywhere uniform, a first etch to substantially remove silicide, a second etch to complete the silicide removal, a third etch to substantially remove polysilicon, and a fourth etch to complete the polysilicon removal.

In addition to mixtures of chlorine and oxygen, other gas mixtures have been attempted. U.S. Pat. No. 5,914,276 to Shin et al. discloses using a mixture of chlorine and nitrogen gases at preferred volumetric flow rates where the nitrogen is 5% to 20% of the total. This range of flow rates was found to strike the proper balance between protecting the silicide/poly interface from lateral overetching and complete removal of the desired portions. A volumetric flow rate for nitrogen above 20% of the total was found to lead to difficulties controlling the critical dimension of the pattern where the metal silicide layer was titanium silicide. Shin, however, was not concerned with the problem of complex topographies where the silicide layer thickness is not everywhere the same at the start of the etch. Therefore, achieving polycide selectivities greater than one was not a goal of Shin.

What is desired, therefore, is a new etch with a polycide selectivity greater than one that is effective to replace the silicide overetch and the poly etch of the prior art and therefore simplify the formation of contact openings in a polycide layer that includes a silicide layer with a varying thickness.

SUMMARY OF THE INVENTION

The present invention discloses a method for etching a plurality of contact openings in a polycide layer where the result of underlying topography creates a silicide layer with a varying thickness. The method of the present invention includes providing a polycide layer disposed over a substrate, forming a patterned mask layer over the polycide layer, and selectively etching exposed portions of the polycide layer with a series of three different etches to form a plurality of contact openings that each expose the substrate. In some embodiments a dielectric layer is disposed between the substrate and the polycide layer and is exposed by the contact openings instead of the substrate. The polycide layer of the present invention includes a polysilicon layer disposed above the substrate and a metal silicide layer disposed above the polysilicon layer. In some embodiments the metal silicide is tungsten silicide. Processes for the formation of the various layers and the patterning of the photoresist layer are well known in the art.

According to the method of the invention the three etches that are applied to form the plurality of contact openings are a silicide etch, a polycide etch, and a poly overetch. The silicide etch defines a plurality of contact openings in the silicide layer where exposed by the patterned photoresist layer by substantially removing the exposed portions of the silicide layer. The silicide etch in some embodiments comprises a plasma of $CF_4$, $Cl_2$, and $N_2$.

The polycide etch extends the plurality of contact openings towards the substrate and continues until the substrate has been exposed by at least one of the plurality of contact openings. The polycide etch employs a plasma of $N_2$ and $Cl_2$ where the $N_2$ is supplied at a flow rate between 20% and about 30%. Mixtures of chlorine and nitrogen in this range advantageously have polycide selectivities greater than one. A selectivity greater than one implies that a contact opening that has advanced into the polysilicon layer will etch more slowly than one still advancing through the silicide layer.

The poly overetch has a high selectivity for polysilicon compared to the substrate. Consequently, the poly overetch has little effect on exposed portions of the substrate but continues to remove polysilicon from those contact openings that are not fully defined. In those embodiments that include a dielectric layer the poly overetch has instead a high selectivity for polysilicon compared to the dielectric layer. The poly overetch is continued until each of the plurality of contact openings exposes the substrate or the dielectric layer. The poly overetch in some embodiments comprises a plasma of HBr, He, and $O_2$, and in further embodiments further includes $N_2$. These These and other aspects and advantages of the present invention will become more apparent when the description below is read in conjunction with the accompanying drawings.

BRIEF DESCRIPTION OF THE DRAWINGS

The present invention will be readily understood by the following detailed description in conjunction with the accompanying drawings, with like reference numerals designating like elements.

DETAILED DESCRIPTION OF THE PREFERRED EMBODIMENTS

Figure 1:
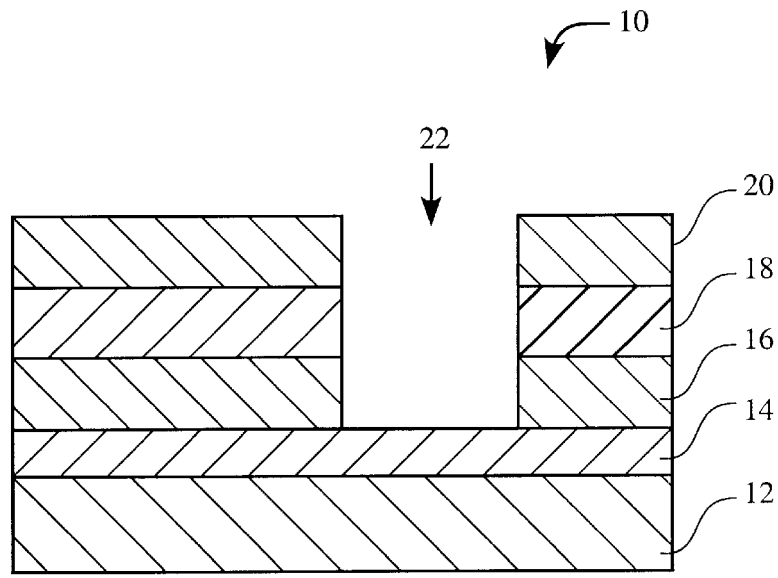
FIG. 1 is a cross-section of a semiconductor stack of the prior art.
Figure 2:
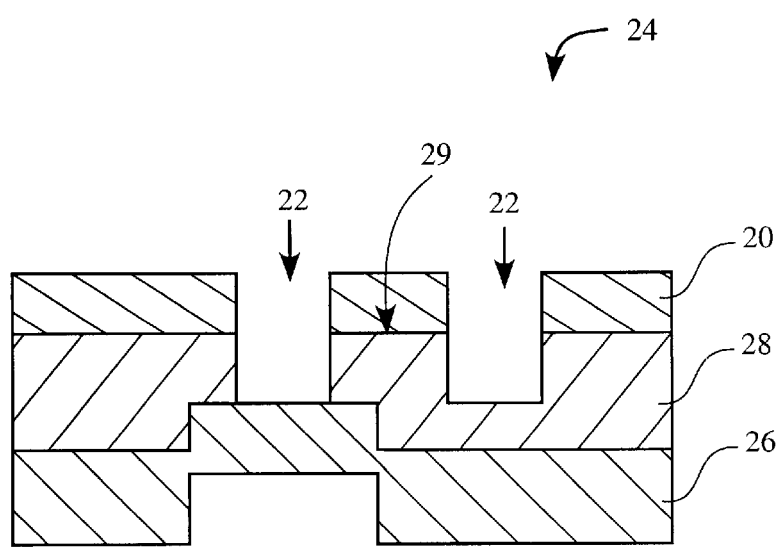
FIG. 2 is a cross-section of semiconductor stack of the prior art having greater topography.
Figure 3:
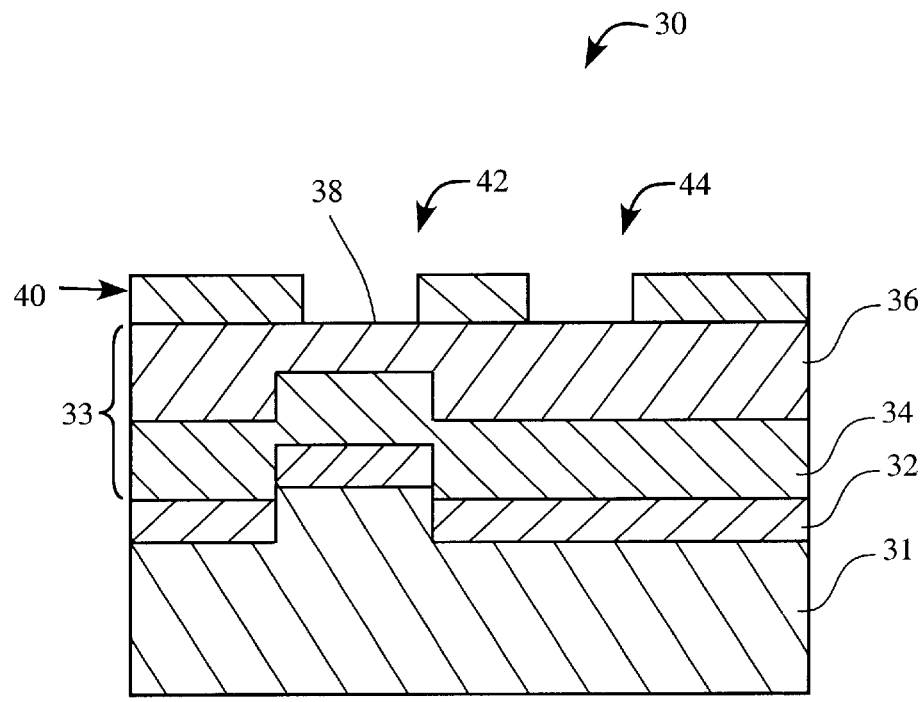
FIG. 3 shows a cross-section of a semiconductor stack as provided according to an embodiment of the method of the invention.

FIGS. 1 and 2 have been described with reference to the prior art. FIGS. 3–7 illustrate etching a polycide layer according to an embodiment of the present invention. In FIG. 3 a semiconductor stack 30 includes a substrate 31, a dielectric layer 32 disposed over the substrate 31, a polycide layer 33 disposed over the dielectric layer 32, and a patterned photoresist layer 40 disposed over the polycide layer 33. The polycide layer 33 includes a polysilicon layer 34 and a metal silicide layer 36. Methods for forming each of these layers are well known in the semiconductor fabrication arts.

Substrate 31 may be a semiconductor wafer such as single crystal silicon, but can also include a stack of layers fabricated on a semiconductor wafer. A stack of layers fabricated on a semiconductor substrate commonly will have a certain amount of topography associated with it, as is represented by the upward protrusion on substrate 31 in FIG. 3. The topography is reflected in the dielectric layer 32, disposed over substrate 31 and formed of a dielectric material such as $SiO_2$. Next, a layer 34 of polycrystalline silicon ("polysilicon") is formed above the dielectric layer 32. The polysilicon layer 34 conforms to the topography of the dielectric layer 32.

A metal silicide layer 36 is formed above the polysilicon layer 34. The metal silicide layer 36 is preferably tungsten silicide, but can also be titanium silicide, for example. The metal silicide layer 36, as formed, tends to be conformal and therefore to reflect the topography of the underlying layers. Preferably, the metal silicide layer 36 is planarized to create a substantially planar surface 38. Planarization can be achieved, for example, by chemical mechanical polishing (CMP) as is well understood in the art. A substantially planar surface 38 is desirable because it aids in the formation of the patterned photoresist layer 40 that is disposed over surface 38.

Patterned photoresist layer 40 is formed and patterned according to photolithography methods that are well known in the art. Accordingly, openings in layer 40 are formed in locations where it is desired to define contact openings through the polycide layer 33 down to the dielectric layer 32 or the substrate 31. Because polysilicon layer 34 reflects the topography beneath it, while planarized silicide layer 36 does not, it follows that a first opening 42 can be located above a thinner portion of silicide layer 36 while a second opening 44 can be located above a thicker portion of silicide layer 36.

According to the present invention the definition of contact openings 42, 44 is initiated by applying a silicide etch to exposed portions of surface 38. The silicide etch is effective to substantially remove the portions of the silicide layer left exposed by the patterned photoresist mask 40, and is preferably applied until approximately 90% to 95% of the exposed portions are removed. Stopping the silicide etch at this point is generally a matter of timing. In other words, the thickness of the silicide layer 36 is typically well known as is the etch rate to be expected from a given etch, so it is a simple matter to calculate the time necessary for a silicide etch to remove approximately 90% to 95% of the exposed portions.

Many silicide etches are known in the art. A preferred silicide etch comprises flowing $CF_4$ at a rate of 70 sccm, $Cl_2$ at a rate of 20 sccm, and $N_2$ at a rate of 18 sccm into a chamber operating at a pressure of 4 milliTorr (mT) while applying 600 W to a top electrode and 35 W to a bottom electrode. This silicide etch is particularly desirable as it is highly uniform across a wafer and has a good etch rate. It will be appreciated, of course, that the present invention may also be practiced without the silicide etch by starting immediately with the polycide etch.

Figure 4:
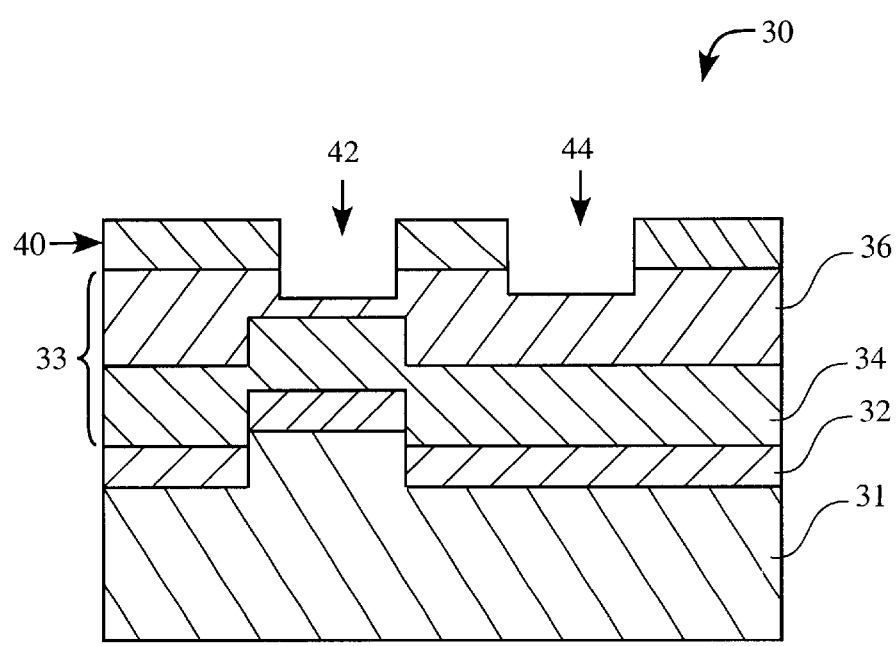
FIG. 4 shows a cross-section of a semiconductor stack partially etched according to an embodiment of the method of the invention.

FIG. 4 shows the stack 30 after the completion of the silicide etch. The method of the invention next applies a polycide etch to stack 30. The polycide etch comprises a plasma formed of chlorine and nitrogen gases supplied to the chamber in a ratio chosen to have a polycide selectivity greater than one. It will be appreciated that the polycide etch will reach the polysilicon layer 34 in those areas where the silicide layer 36 is thin sooner than in those areas where the silicide layer 36 is thick. Thus, first opening 42 will etch into the polysilicon layer 34 while second opening 44 is still being defined into the silicide layer 36.

Figure 5:
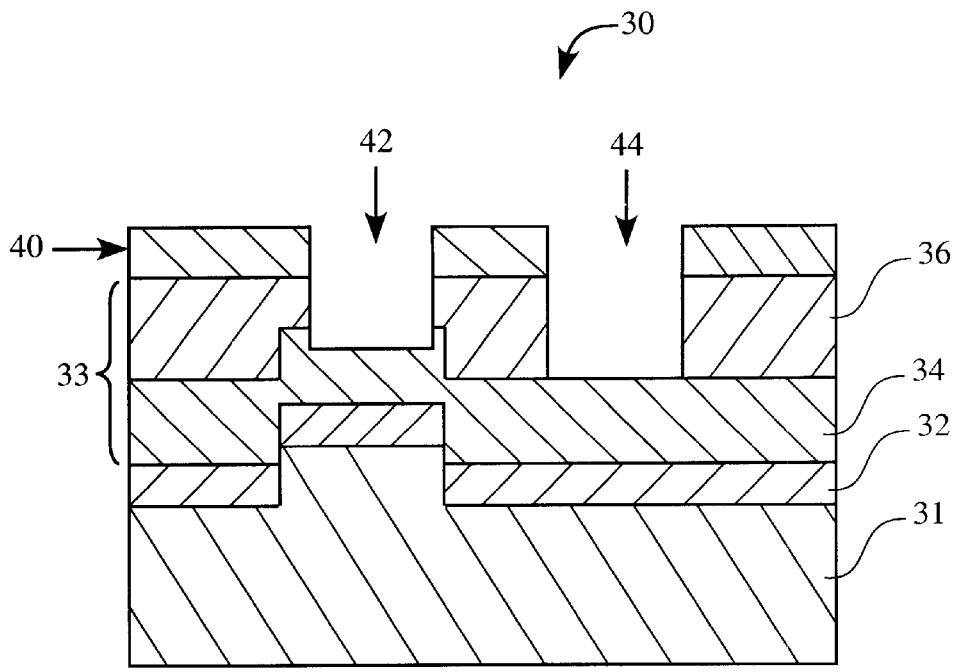
FIG. 5 shows a cross-section of a semiconductor stack further partially etched according to an embodiment of the method of the invention.

FIG. 5 shows a cross-section of the semiconductor stack 30 as contact openings 42 and 44 are further defined by the polycide etch. Because the polycide etch has a polycide selectivity greater than one, it will be apparent that first opening 42 will be defined into polysilicon layer 34 more slowly than second opening 44 will continue to be defined into silicide layer 36. Once both contact openings 42, 44 have reached the polysilicon layer 34 they will thereafter be defined into the polysilicon layer 34 at the same rate until first opening 42 reaches the dielectric layer 32.

Table 1 gives the polycide selectivity for three nitrogen flow rates according to the method of the present invention. The greater the polycide selectivity, the smaller the penetration of first opening 42 into the polysilicon layer 34 before second opening 44 enters the polysilicon layer 34. Consequently, the exposed residual polysilicon in second opening 44 remaining when first opening 42 is completed to the dielectric layer 32 is reduced as the polycide selectivity is increased. Thus, increasing the polycide selectivity has the effect of reducing the amount of polysilicon left to be removed by the subsequent poly overetch.

TABLE 1

Selectivity vs. Nitrogen Flow Rate

| $N_2/(N_2 + Cl_2)$ | Selectivity |
|---|---|
| 0.11 | 1.05 |
| 0.2 | 1.47 |
| 0.3 | 1.7 |

A preferred polycide etch comprises flowing $Cl_2$ at a rate of 80 sccm and $N_2$ at a rate of 20 sccm into a chamber operating at a pressure of 4 mT while applying 450 W to a top electrode and 60 W to a bottom electrode. Another preferred polycide etch applies is 70 W to the bottom electrode.

Figure 6:
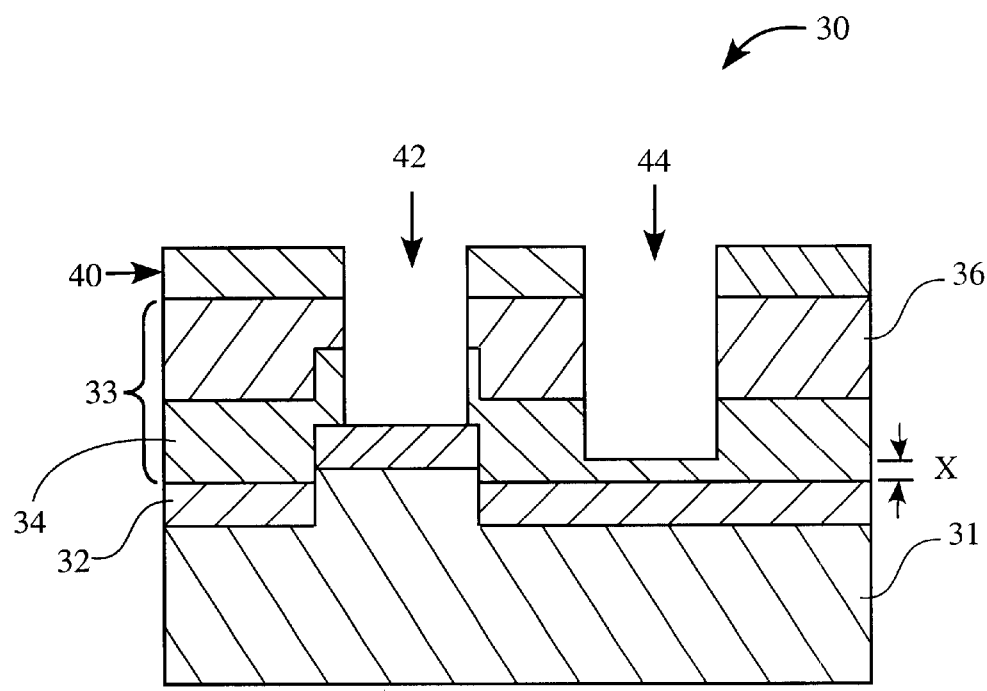
FIG. 6 shows a cross-section of a semiconductor stack still further partially etched according to an embodiment of the method of the invention.

FIG. 6 illustrates the end point of the polycide etch. The polycide etch endpoint can be detected by monitoring the reaction products for an indication that the dielectric layer 32 has been exposed. Such endpoint detectors are well known in the art. It can be seen that the polycide etch is completed when first opening 42 is etched to the dielectric layer 32. At this point second opening 44 is not yet through to the dielectric layer 32. Instead, an exposed residual amount of polysilicon with a thickness of x still remains to be removed from above the dielectric layer 32. As previously described, this may be accomplished by switching to a poly overetch that has a high selectivity between polysilicon and the dielectric material. Clearly, the time needed to perform a poly overetch will be minimized when the thickness x is minimized, as is the case when the polycide selectivity is maximized.

Figure 7:
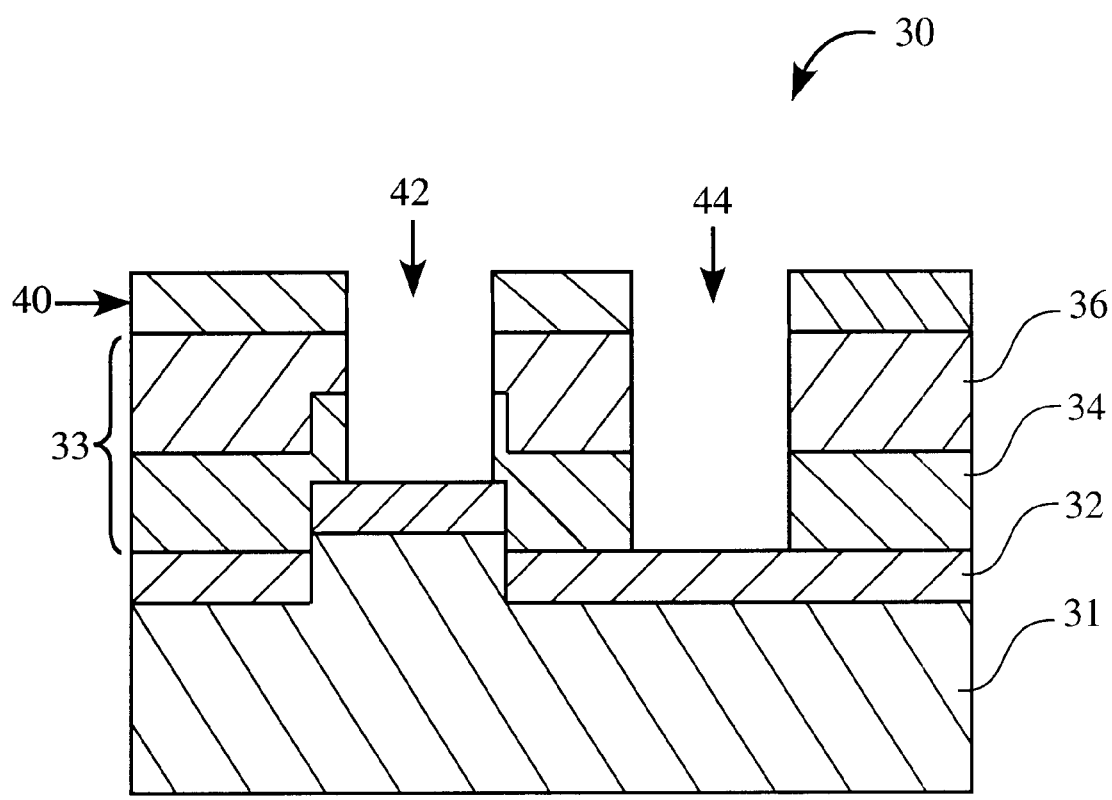
FIG. 7 shows a cross-section of a semiconductor stack completely etched according to an embodiment of the method of the invention.

FIG. 7 illustrates the end point of the poly overetch. It can be seen that at the completion of the poly overetch both contact openings 42, 44 have been defined through to the dielectric layer 32. A preferred poly overetch comprises flowing HBr at a rate of 70 sccm and a mixture of He and $O_2$ at a rate of 10 sccm into a chamber operating at a pressure of 40 mT while applying 220 W to a top electrode and 50 W to a bottom electrode. Another preferred poly overetch adds 5 sccm of N2 to the other process gases flowing into the chamber.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming a plurality of contact openings, comprising:

providing a polycide layer disposed over a substrate, said polycide layer including a polysilicon layer disposed above said substrate and a metal silicide layer disposed above said polysilicon layer;

forming a patterned mask layer over a first portion and a second portion of said polycide layer to expose said metal silicide layer, the first portion defined over a thinner polycide layer than the second portion;

selectively etching with a silicide etch said silicide layer to define a first and second contact opening therein, said silicide etch being effective to substantially remove said exposed portions of said silicide layer;

performing a polycide etch to extend said contact openings towards said substrate and continuing until said substrate has been exposed at said first contact opening, said polycide etch having a polycide selectivity greater than one such that said metal silicide layer is etched at a faster rate than said polysilicon layer; and performing a poly overetch such that the second contact opening exposes said substrate.

2. The method of claim 1 wherein said metal silicide layer is tungsten silicide.

3. The method of claim 1 wherein a dielectric layer is disposed between said substrate and said polysilicon layer and wherein said poly overetch exposes said dielectric layer.

4. The method of claim 1 wherein said silicide etch comprises a plasma of $CF_4$, $Cl_2$, and $N_2$.

5. The method of claim 1 wherein said poly overetch comprises a plasma of HBr, He, and $O_2$.

6. The method of claim 5 wherein said plasma further includes $N_2$.

7. The method of claim 1 wherein said polycide etch comprises a plasma of $N_2$ and $Cl_2$ and said $N_2$ is supplied at a flow rate between 20% and about 30%.

8. A method for forming a plurality of contact openings, comprising:

providing a polycide layer disposed over a substrate, said polycide layer including a polysilicon layer disposed above said substrate and a metal silicide layer disposed above said polysilicon layer;

forming a patterned mask layer over a first portion and a second portion of said polycide layer to expose said metal silicide layer, the first portion defined over a thinner polycide layer than the second portion;

selectively etching with a polycide etch said polycide layer to define a first and second contact opening therein, said polycide etch continuing until said substrate has been exposed, said polycide etch having a polycide selectively greater than one such that said metal silicide layer is etched at a faster rate than said polysilicon layer; and performing a poly overetch such that the second contact opening exposes said substrate.

9. The method of claim 8 wherein said metal silicide layer is tungsten silicide.

10. The method of claim 8 wherein a dielectric layer is disposed between said substrate and said polysilicon layer and wherein said poly overetch exposes said dielectric layer.

11. The method of claim 8 wherein said silicide etch comprises a plasma of $CF_4$, $Cl_2$, and $N_2$.

12. The method of claim 8 wherein said poly overetch comprises a plasma of HBr, He, and $O_2$.

13. The method of claim 12 wherein said plasma further includes $N_2$.

14. The method of claim 8 wherein said polycide etch comprises a plasma of $N_2$ and $Cl_2$ and said $N_2$ is supplied at a flow rate between 20% and about 30%.

15. A method for making contact openings, comprising:

providing a polycide layer disposed over a dielectric layer that is defined over a substrate, said polycide layer including a polysilicon layer disposed above said dielectric layer and a metal silicide layer disposed above said polysilicon layer;

forming a patterned mask layer over a first portion and a second portion of said polycide layer to expose said metal silicide layer, the first portion defined over a thinner polycide layer than the second portion;

etching with a silicide etch chemistry including $CF_4$, $Cl_2$, and $N_2$, said silicide layer to define a first contact opening and a second contact opening therein, said silicide etch chemistry being effective to substantially remove said exposed portions of said silicide layer;

performing a polycide etch to extend said first and second contact openings towards said dielectric layer and continuing until said dielectric layer has been exposed at said first contact opening, said polycide etch having a polycide selectivity greater than one such that said metal silicide layer is etched at a faster rate than said polysilicon layer; and performing a poly overetch with a plasma defined using HBr, He, and $O_2$, such that the second contact opening exposes said dielectric layer, the poly overetch ensuring that both the first and second contact openings expose said dielectric layer.

16. The method of claim 15 wherein said polycide etch comprises a plasma of $N_2$ and $Cl_2$ and said $N_2$ is supplied at a flow rate between 20% and about 30%.

* * * * *